(12) United States Patent
Fortin et al.

(10) Patent No.: US 8,071,486 B2
(45) Date of Patent: Dec. 6, 2011

(54) METHOD FOR REMOVING RESIDUES FORMED DURING THE MANUFACTURE OF MEMS DEVICES

(75) Inventors: Vincent Fortin, Bromont (CA); Jean Ouellet, St-Alphonse de Granby (CA)

(73) Assignee: Teledyne Dalsa Semiconductor Inc., Thousand Oaks, CA (US)

( * ) Notice: Subject to any disclaimer, the term of this patent is extended or adjusted under 35 U.S.C. 154(b) by 841 days.

(21) Appl. No.: 11/457,911

(22) Filed: Jul. 17, 2006

(65) Prior Publication Data

US 2007/0134927 A1    Jun. 14, 2007

Related U.S. Application Data

(60) Provisional application No. 60/699,852, filed on Jul. 18, 2005.

(51) Int. Cl.
*H01L 21/461* (2006.01)
*H01L 21/302* (2006.01)

(52) U.S. Cl. .................. 438/725; 438/706; 438/734

(58) Field of Classification Search .............. 438/725, 438/706, 734
See application file for complete search history.

(56) References Cited

U.S. PATENT DOCUMENTS

| | | | |
|---|---|---|---|
| 5,200,361 | A | 4/1993 | Onishi |
| 5,658,417 | A | 8/1997 | Watanabe et al. |
| 6,074,951 | A | 6/2000 | Kleinhenz et al. |
| 6,740,247 | B1 | 5/2004 | Han et al. |
| 6,869,487 | B1 | 3/2005 | Bergman |
| 2003/0080082 | A1* | 5/2003 | Chinn et al. ............ 216/2 |
| 2004/0123879 | A1 | 7/2004 | Yim et al. |
| 2004/0206120 | A1* | 10/2004 | Yamamura .............. 65/31 |

FOREIGN PATENT DOCUMENTS

EP    0 746 016 A2    4/1996
WO   WO 00/07220    2/2000

OTHER PUBLICATIONS

Lee et al. (IEEE Transactions on Electron Devices, IEDM 96-761, (1996), pp. 30.1.1-30.1.4).*

* cited by examiner

*Primary Examiner* — Nadine Norton
*Assistant Examiner* — Mahmoud Dahimene
(74) *Attorney, Agent, or Firm* — Marks & Clerk; Richard J. Mitchell

(57) ABSTRACT

A method of removing residues from an integrated device, in particular residues resulting from processing in HF vapor, is disclosed wherein the fabricated device is exposed to dry water vapor for a period of time sufficient to dissolve the residues in the dry water vapor.

9 Claims, 16 Drawing Sheets

| Element | Atomic concentration (%) |
|---|---|
| F | 2.6 |
| Al | 1.0 |
| O | 23.5 |
| N | 29.8 |
| C | 9.6 |
| Cl | Not detected |
| Si | 33.5 |

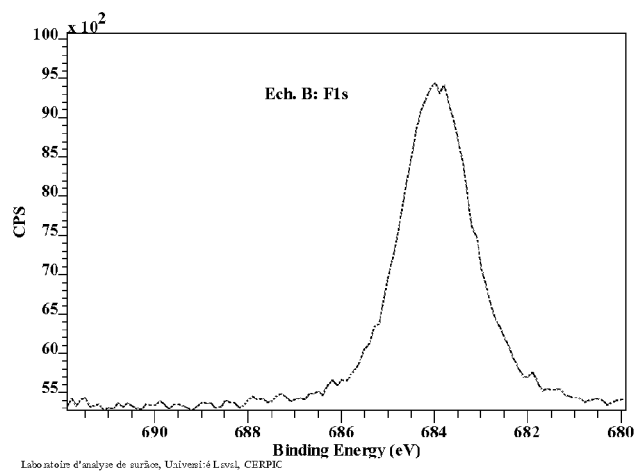
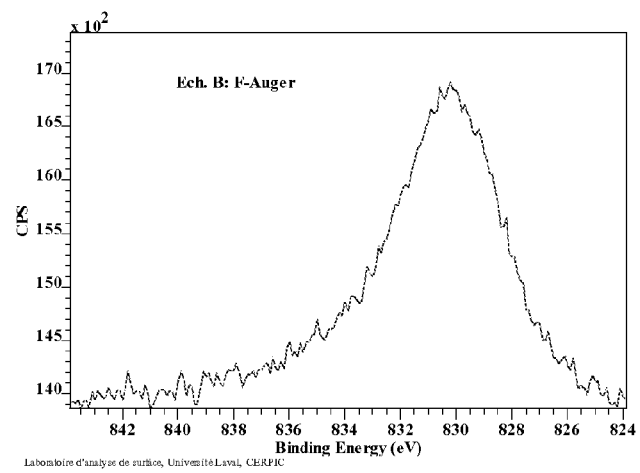
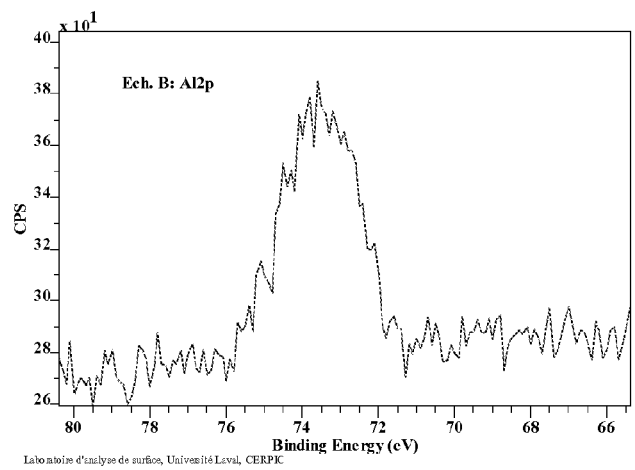
Fig. 3

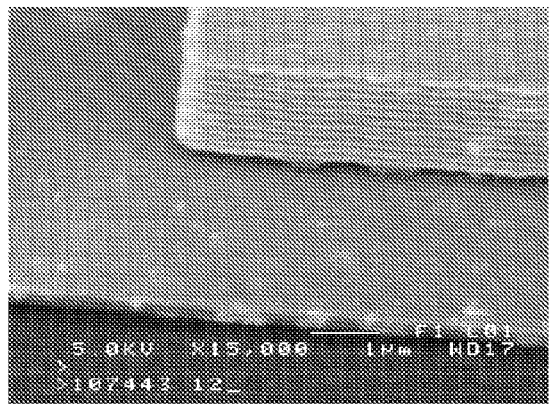 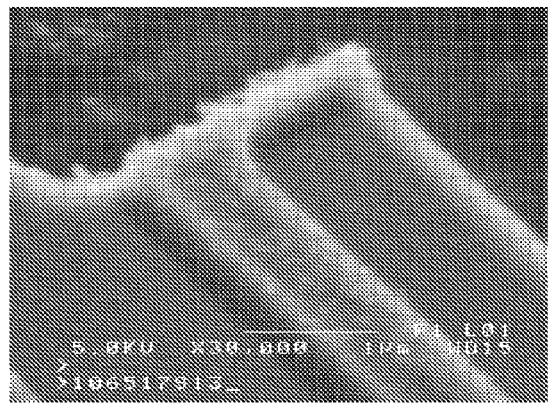
On top of the devices	Under flipped Poly-Si release structures
Fig. 4
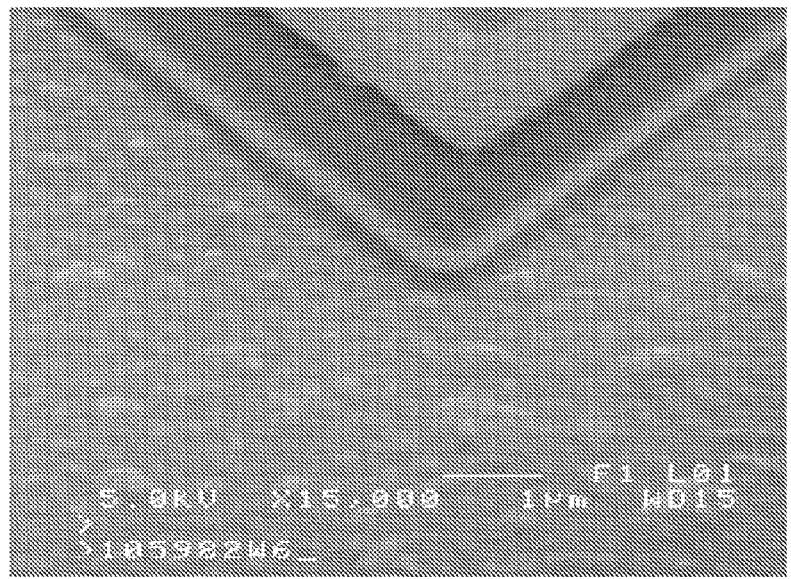
Fig. 5

| Element | Atomic concentration (%) |
|---|---|
| F | 0.3 |
| Al | 1.2 |
| O | 65.3 |
| N | 0.3 |
| C | 4.2 |
| Cl | Not detected |
| Si | 28.7 |

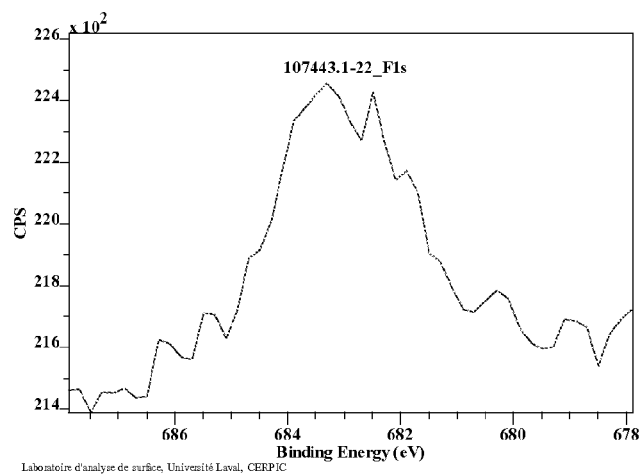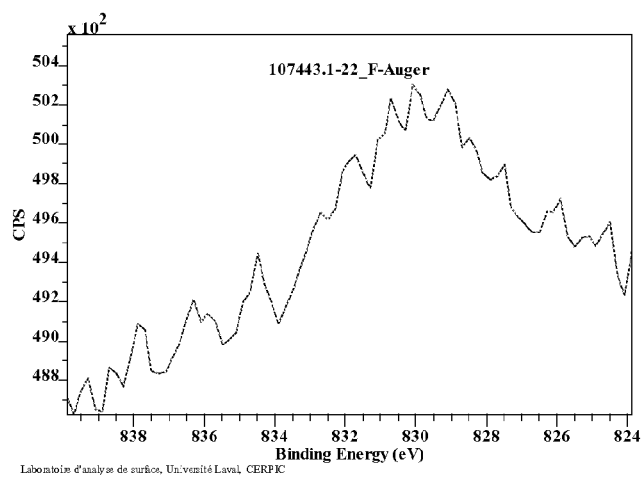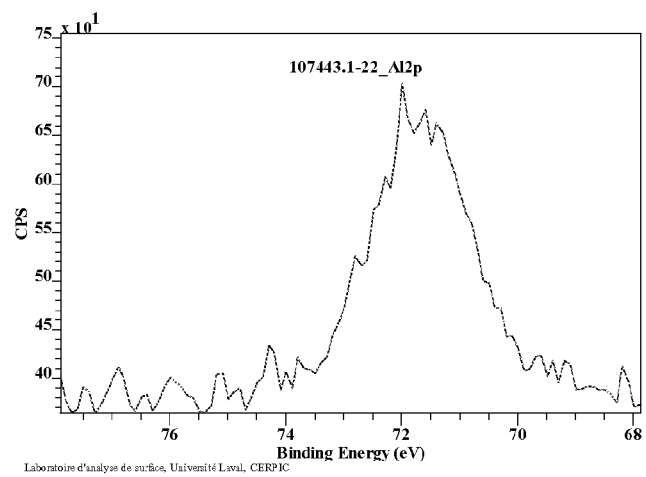
Fig. 8

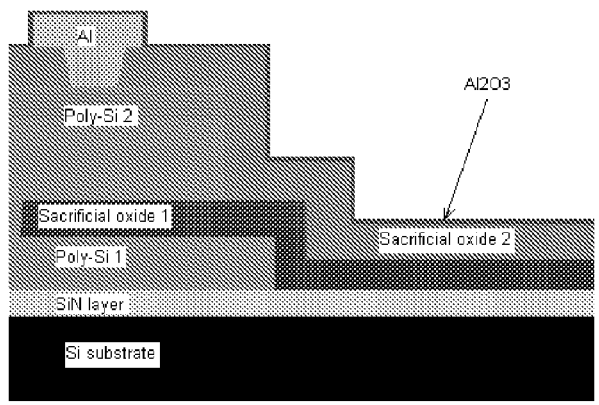
Step 1 – Prior to Vapor HF
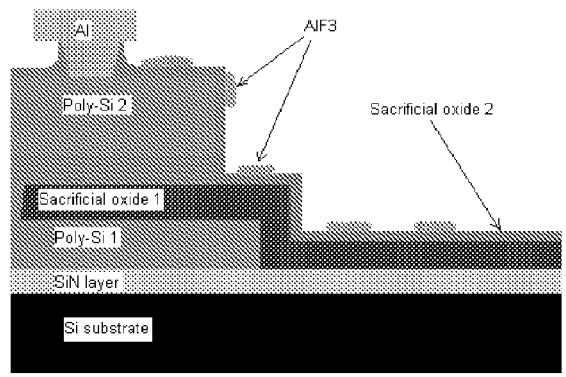
Step 2 – During Vapor HF processing
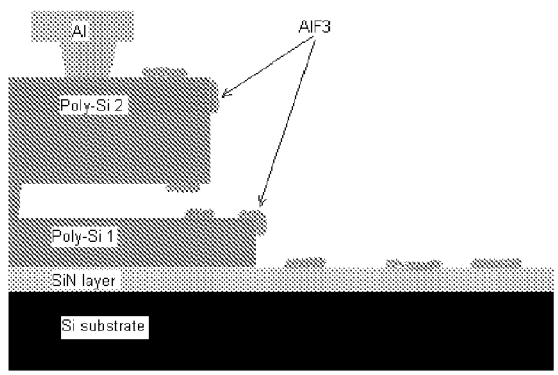
Step 3 – After Vapor HF release step
Fig. 9

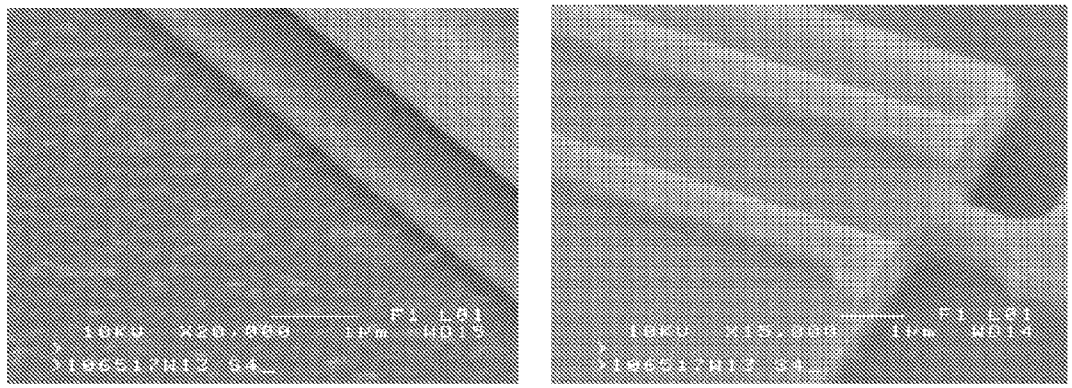
In the field area along devices     Under flipped Poly-Si release structures
Fig. 12
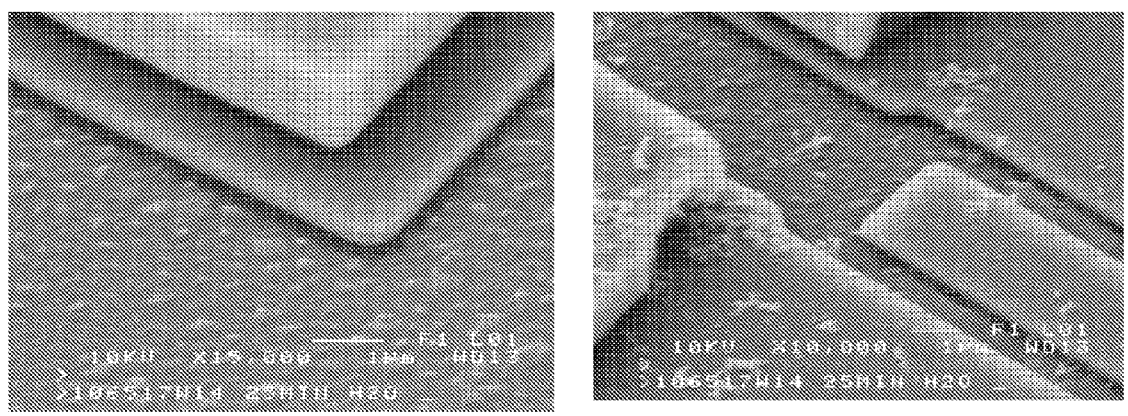
In the field area along devices     Fig. 13     Under Poly-Si release structures
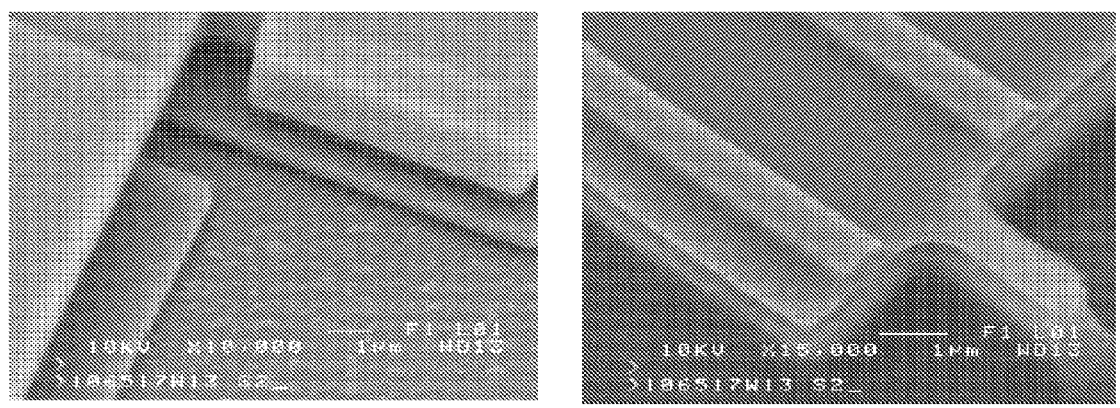
In the field area along devices     Under Poly-Si release structures
Fig. 14

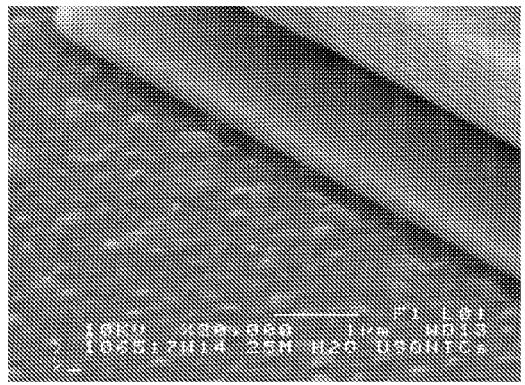 
In the field area along devices    Under flipped Poly-Si release structures
Fig. 15
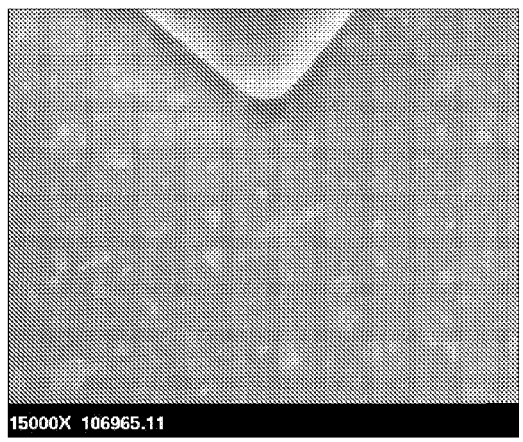 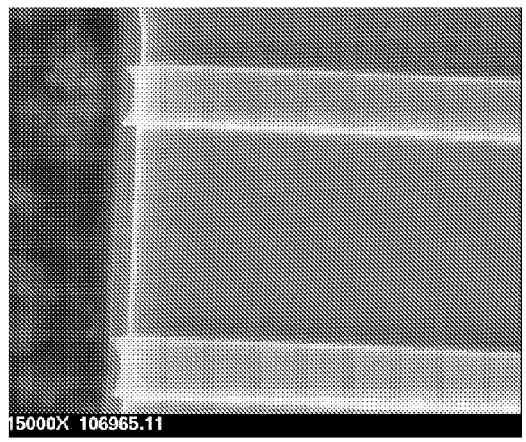
In the field area along devices    Under flipped Poly-Si release structures
Fig. 16

| Element | Atomic concentration (%) |
|---|---|
| F | 0.18 |
| Al | 0.7 |
| O | 30.2 |
| N | 25.6 |
| C | 7.9 |
| Cl | 0.2 |
| Si | 35.3 |

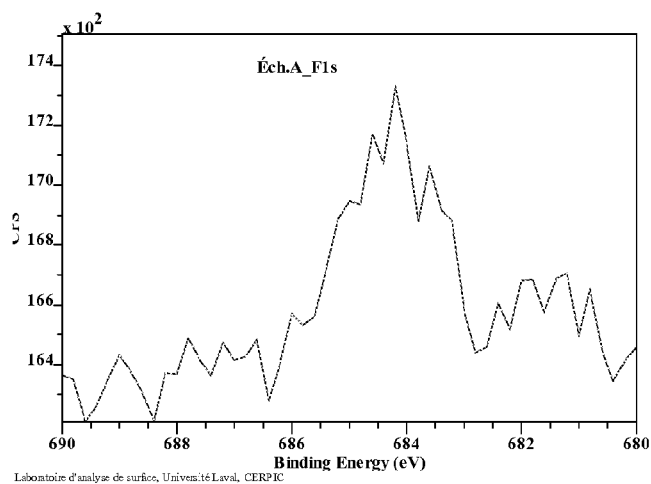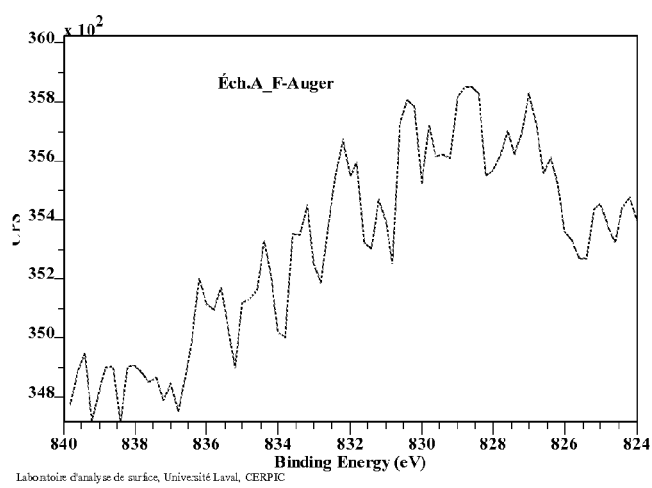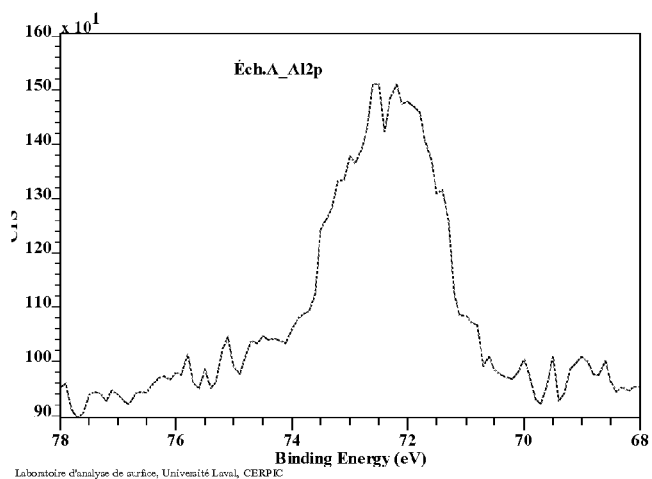
Fig. 19

|  | | Prior to Vapor HF process | After Vapor HF process | After water vapor clean |
|---|---|---|---|---|
| Atomic concentration (%) | F | 0.3 | 2.6 | 0.18 |
| | Al | 1.2 | 1.0 | 0.7 |
| | O | 65.3 | 23.5 | 30.2 |
| | N | 0.3 | 29.8 | 25.6 |
| | C | 4.2 | 9.6 | 7.9 |
| | Cl | Not detected | Not detected | 0.2 |
| | Si | 28.7 | 33.5 | 35.3 |
| Al2p biding energy (eV) | | 75.0 | 75.8 | 74.75 |
| F/Al atomic ratio | | 0.25 | 2.6 | 0.26 |
| Proposed Al-based compound | | $Al_2O_3$ | $AlF_3$ | $Al_2O_3$ |

Note: All XPS spectra were gathered in the field areas in-between MEMS devices.

Fig. 20

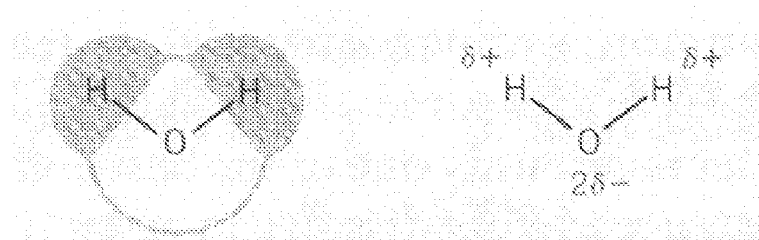

Fig. 21

| Medium | D |
|---|---|
| Air | 1.0 |
| Cyclohexane, $C_6H_{12}$ | 2.015 |
| Carbon tetrachloride, $CCl_4$ | 2.228 |
| Benzene, $C_6H_6$ | 2.274 |
| Chloroform, $CHCl_3$ | 4.8 |
| Acetone, $CH_3COCH_3$ | 20.7 |
| Ethanol, $CH_3CH_2OH$ | 24.30 |
| Methanol, $CH_3OH$ | 32.63 |
| Water, $H_2O$ | 78.54 |
| Anhydrous $H_2SO_4$ | 101. |

Fig. 22

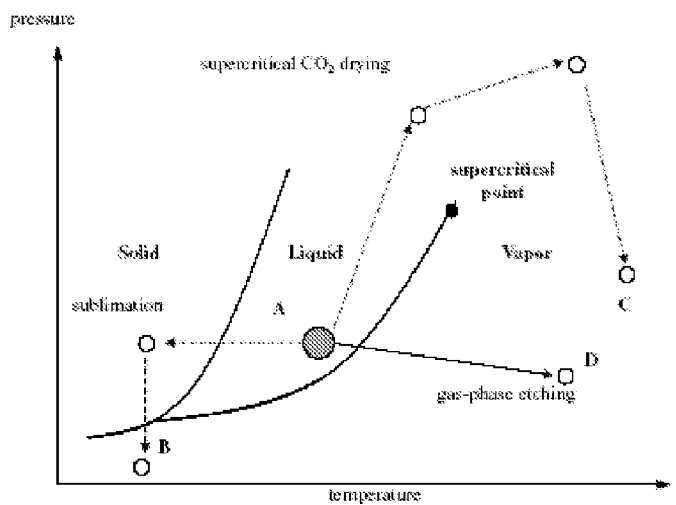
Fig. 26
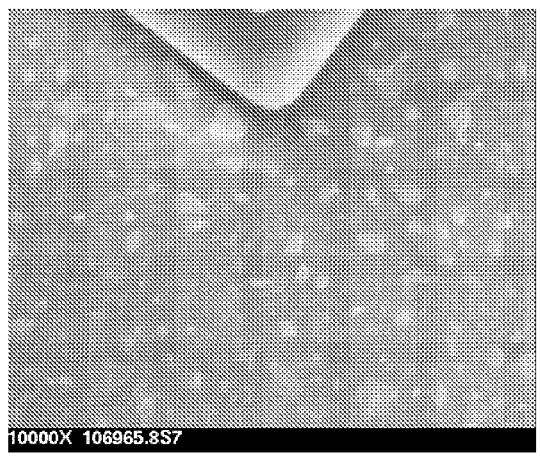 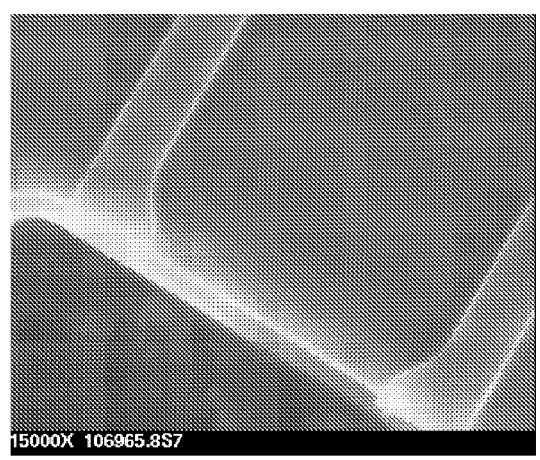
In the field area along devices  Under flipped Poly-Si release structures
Fig. 28

In the field area along devices  
Under flipped Poly-Si release structures

METHOD FOR REMOVING RESIDUES FORMED DURING THE MANUFACTURE OF MEMS DEVICES

CROSS REFERENCE TO RELATED APPLICATION

This application claims the benefit under 35 USC 119(e) of prior U.S. provisional application No. 60/699,852, filed Jul. 18, 2005, the contents of which are herein incorporated by reference.

FIELD OF THE INVENTION

This invention relates to the field of integrated device manufacture, and in particular to the manufacture of MEMS and like devices.

BACKGROUND OF THE INVENTION

The manufacture of Micro-Electro-Mechanical Systems (MEMS) such as micro-gyroscopes, micro-accelerometers, RF micro-resonators, micro-mirrors, micro-motors, micro-actuators and other such micro-devices integrating very sensitive moving mechanical parts causes a very serious challenge for a number of reasons including the facts that:
  a. These very sensitive mechanical parts are typically made of silicon (polysilicon or silicon-germanium);
  b. The sacrificial material underlying these mechanical parts to be released is typically silicon oxide;
  c. The etch stop layer underlying this silicon oxide sacrificial layer is typically silicon nitride or silicon (polysilicon or silicon-germanium);
  d. The mechanical release of the mechanical parts requires the removal of the sacrificial material in liquid or vapor HF-based chemistries;
  e. A liquid HF-based solution does not allow one to perform a release in presence of a CMOS compatible Al metallization scheme;
  f. A vapor HF-based approach on the other hand leads to undesirable post-release residues that are detrimental to the functionality of the MEMS devices as they block or limit the movements of the released parts.

A method for removing those post vapor HF residues is therefore required in order to allow MEMS released structures to properly move without any potential blocking of the mechanisms. The selected method must not lead to any stiction that could obviously also be detrimental to the functionality of the devices.

A number of prior art solutions exist for removing such residues.

Liquid HF-based Chemistries

Liquid buffered HF (BHF) chemistries and non-buffered HF solutions have been used to mechanically release the sacrificial oxides underlying the silicon-based (polysilicon-based or silicon-germanium-based) structures. The problem with liquid non-buffered-HF solutions is that they quickly attack the Al-based metallization schemes which are CMOS compatible. It has been reported by Witvrouw et al that the etch rate of Al in non-buffered HF chemistries is of 800±600 nm/min. In addition, Ti displays an etch rate of 1200±600 nm/min while a TiN film demonstrates an etch rate of 0.4±0.2 nm/min. Although a TiN film is CMOS compatible, this film is known to have an intrinsic resistivity (~50-100 $\mu\Omega$-cm) much higher than the one of Al-based materials (~2.7 $\mu\Omega$-cm). TiN therefore may not be suitable for MEMS applications needing a low interconnection resistance.

On the other hand, Witvrouw et al reported slower etch rates for Al, Ti and TiN in buffered HF chemistries. The etch rates demonstrated were of 0.4±0.1 nm/min, 60±30 nm/min and 0.06±0.05 nm/minn for Al, Ti and TiN, respectively. The problem with BHF solutions is that improperly rinsed BHF released wafers will result in an undesirable precipitation of solid ammonium fluorosilicate, $(NH_4)_2SiF_6$ crystals under the released mechanical parts. This clearly undesirable effect related to the use of BHF solutions is to be prevented in the manufacturing of MEMS devices.

Advanced MEMS devices need to integrate digital and/or analog CMOS control electronics and/or high voltage CMOS drivers capable of performing actuation functions. Since this CMOS electronics needs to be exposed to the release chemicals, the liquid HF-based solutions should not chemically attack the metal-based interconnection of the CMOS systems. Based on the CMOS compatibility requirements, gold (Au), although resistant to liquid HF-based solutions according to Willams et al., could not be considered as it is not CMOS compatible.

Even though a liquid HF-based solution leads to severe issues in presence of metals for CMOS control/actuation electronics, one could circumvent this problem by performing a release prior to the metallization step. This however also involves many potential issues such as:
  a. potential metal residues in-between released structures;
  b. Sputtering of metal is impossible due to item a above;
  c. Al or other metal evaporation means a lift-off approach in conjunction with the metal evaporation techniques. Therefore, the resist strip involves liquid exposure during the remaining steps which would leave the devices prone to stiction; and
  d. Low yield and cross-contamination due to potential breakage of devices along the fabrication processes that could contaminate other products.

Such techniques are discussed in A. Witvrouw, B. Du Bois, P. De Moor, A. Verbist, C. Van Hoof, H. Bender and K. Baert, *A comparison between wet HF etching and vapor HF etching for sacrificial oxide removal*, Proc. SPIE Micromachining and Microfabrication Process Technology VI; September. 2000, Vol. 4174, 2000, pp. 130-141. K. R. Williams, K. Gupta and M. Wasilik, *Etch rates for micromachining processing—Part II*, Journal of Microelectromechanical Systems, Vol. 12, No. 6, December. 2003, 761-778.

Vapor HF-based Chemistries

Witvrouw et al. showed that Al-based metallization schemes exhibit a low etch rate of 0.03 nm/min in Vapor HF. The etch rates of Ti and TiN are of 0.19±0.02 nm/min and 0.06±0.02 nm/min, respectively. Although the above etch rates are low, one needs to remember that MEMS devices need, in some cases, to have structures released over hundreds of microns. Such excessive etch requirements therefore require excessive etch times therefore leading to an attack of the metal schemes to some extent. On the other hand, it has been demonstrated that the anhydrous HF gas-phase etching conditions used by Ouellet et al. prevent any attack of the metal structures. Even though performing a Vapor HF release in the conditions used by Ouellet et al. prevents the etch of the metal structures, it still potentially leads to the formation of undesirable fluorine-based by-products that are detrimental to the functionality of the devices as they can potentially block or limit the movements of the MEMS-released structures.

Metal-based Residues

It has been noticed by Tong et al. for example in the case of post via etch clean that $AlF_3$ would be formed by the reaction between the gas-phase HF and the $Al_2O_3$ which is the native oxide that forms on Al upon exposure to air. The formation of $AlF_3$ would then be formed according to the following equation:

$$Al_2O_3\ (s) + 6\ HF\ (g) \rightarrow 2\ AlF_3\ (s) + 3\ H_2O\ (g)$$

Although the invention from Ouellet et al described in US patent application No. 2005/0142685 addresses the removal of the toxic ammonium fluorosilicate crystals which can be formed in the presence or absence of metallization schemes on the wafer during the Vapor HF release of the MEMS mechanical structures, it does not cover the contaminants formed due to the presence of metal.

Many others have conducted studies or were granted patents related to Vapor HF processes performed in presence of metal. However, none of them (beside Tong et al.) covered the formation of residues due to the exposure of metallized devices to Vapor HF. The studies and inventions done by other individuals or groups are presented below.

Kim et al.'s invention (US patent application No. US 2004/0018683 A1) is related to the use of Vapor HF performed in presence of metal for storage (memory) devices. However, there is no mention about the potential formation of residues due to such an exposure to a Vapor HF process. In addition, Onishi's invention (U.S. Pat. No. 5,200,361) is related to the use of Vapor HF in order to clean the $AlF_3$ and $Al_2O_3$ residues formed during the $SF_6$ plasma etch of vias. However, it is most likely that in that case the $AlF_3$ residues are swept away (since $AlF_3$ is not soluble in acids) during the Vapor HF process. Tsutsui et al. (U.S. Pat. No. 5,922,623) experimented Vapor HF in presence of WSi and AlGaAs without noticing any abnormal issue. Finally, Scheiter et al. (U.S. Pat. No. 5,662,772) also used Vapor HF in presence of Al or other metal but no Post Vapor HF residue formation is discussed.

Beside that, Bergman's inventions (US patent applications No. US 2004/0069320 A1, US 2001/0029965 A1, US 2001/0027799 A1, US 2001/0017143 A1 and patents No. U.S. Pat. No. 6,830,628 B2, U.S. Pat. No. 6,240,933 B1, U.S. Pat. No. 6,240,933 B1, U.S. Pat. No. 6,843,857 B2) all focus on cleaning of Si substrates in order to remove the metallic contaminations. However, there is no discussion related to the formation of residues as such residue formation is most likely minimal. A similar application was discussed by Ma et al. but the formation of residues due to the presence of metal during the vapor phase HF etch is not covered in this publication.

As for Tong et al., they did report the formation of $AlF_3$ from $Al_2O_3$ in presence of Vapor HF. However, they perceived $AlF_3$ as an advantage for via resistance purposes. There was therefore no discussion related to the removal of such a by-product. For MEMS applications on the other hand, the removal of this Al fluoride compound is critical for the functionality of the devices.

It is worth mentioning that Chhabra et al were granted a patent (U.S. Pat. No. 5,089,084) in 1992 for the invention of a system in order to perform an in-situ Vapor HF/DI water cascade rinse process. Such a system was intended for Integrated Circuits as opposed to MEMS devices. Even though this invention could allow one to remove the inorganic residues formed during the Vapor HF process in presence of Al (or any other metal), this approach presents many drawbacks for MEMS applications, namely:

a. As this method is intended for CMOS processes, the wafers are not appropriately dried which would in turn lead to released structures of advanced MEMS devices displaying severe stiction problems;

b. Although the "agitation" found in a cascade-type of rinse could allow one to clear the inorganic residues formed during the Vapor HF process, this approach may not be suitable for fragile advanced MEMS devices as it could be prone to breakage due to the harsh mechanical action during a cascade rinse;

c. Such an apparatus proposed by Chhabra et al. does not exhibit any flexibility in terms of water temperature nor the possibility to use a gentle "molecular" excitation of the DI water.

The above techniques are discussed in the following references: CRC Handbook of Chemistry and Physics, Edited by R. C. Weast, CRC Press, Inc., Boca Raton, Fla. 33431, 1979-1980 Edition; N. Chhabra and L. Gibbons, Hydrofluoric acid etcher and cascade rinser, U.S. Pat. No. 5,089,084, Feb. 18, 1992; S. Onishi, Process for preparing a semiconductor device using hydrogen fluoride and nitrogen to remove deposits, U.S. Pat. No. 5,200,361, Apr. 6, 1993; Y. Ma, M. L. Green, L. C. Feldman, J. Sapjeta, K. J. Hanson and T. W. Weidman, Vapor phase $SiO_2$ etching and metallic contamination removal, J. Vac. Sci. Technol. B, Vol. 13, No. 4, July/August 1995, 1460-1465; J. K. Tong, J. S. Martin, T. C. Rogers and D. J. Syverson, Removal of polymeric/silicate residues and reduction of contact resistance for inter-metal via holes by vapor phase HF cleaning, Proceedings of the Fourth International Symposium on Cleaning Technology in Semiconductor Device Manufacturing, Editors R. E. Novak and J. Ruzyllo, 1996, 235-242; T. Scheiter, U. Naeher and C. Hierold, Method for the selective removal of silicon dioxide, U.S. Pat. No. 5,662,772, Sep. 2, 1997; H. Tsutsui, T. Matsumura, H. Oikawa, M. Yokoi, J. Nakamura, H. Sato and J. Mizoe, Hydrogen fluoride vapor phase selective etching methode for fabricating semiconductor devices, U.S. Pat. No. 5,922,623, Jul. 13, 1999; A. Witvrouw, B. Du Bois, P. De Moor, A. Verbist, C. Van Hoof, H. Bender and K. Baert, A comparison between wet HF etching and vapor HF etching for sacrificial oxide removal, Proc. SPIE Micromachining and Microfabrication Process Technology VI; September 2000, Vol. 4174, 2000, pp. 130-141; E. J. Bergman, Methods for cleaning semiconductor surfaces, U.S. Pat. No. 6,240,933 B1, Jun. 5, 2001; E. J. Bergman, Methods for cleaning semiconductor surfaces, US patent application No. US 2001/0017143 A1, Aug. 30, 2001; E. J. Bergman, Methods for cleaning semiconductor surfaces, US patent application No. US 2001/0027799 A1, Oct. 11, 2001; E. J. Bergman, Methods for cleaning semiconductor surfaces, US patent application No. US 2001/0029965 A1, Oct. 18, 2001.; S.-Y. Kim, K.-T. Lee and Y. P. Han, Method of manufacturing storage nodes of a semiconductor memory device using a two-step etching process, US patent application No. US 2004/0018683 A1, Jan. 29, 2004; E. J. Bergman, Methods for cleaning semiconductor surfaces, U.S. patent application No. US 2004/0069320 A1, Apr. 15, 2004; E. J. Bergman, Methods for cleaning semiconductor surfaces, U.S. Pat. No. 6,830,628 B2, Dec. 14, 2004; E. J. Bergman, Methods for cleaning semiconductor surfaces, U.S. Pat. No. 6,843,857 B2, Jan. 18, 2005; and L. Ouellet, G. Migneault and J. Li, A new anhydrous HF release process for MEMS, US patent application 2005/0142685.

Non-metal Based Residues

The reaction between Silicon Nitride ($Si_3N_4$) used as an etch stop during the release process and the Vapor HF leads to the formation of ammonium fluorosilicate residues as follow:

$$Si_3N_4\ (s) + 16\ HF\ (g) \rightarrow 2(NH_4)_2SiF_6\ (s) + SiF_4\ (g)$$

This ammonium fluorosilicate residue is thermally unstable and decomposes at a temperature higher than 100° C. as follows:

$$(NH_4)_2SiF_6\ (s) \rightarrow NH_4HF_2\ (s) + SiF_4\ (g) + NH_3\ (g)$$

For the $(NH_4)_2SiF_6$ and the $NH_4HF_2$ compounds, those residues can be eliminated by performing and ex-situ or an in-situ annealing step or by operating the Vapor HF release at a triple point at a pressure of less than 40 Torr and a temperature above 100° C. as reported by Ouellet et al, supra. However, Ouellet et al. did not address the possibility that their invention could leave some fluorine-based residues behind.

SUMMARY OF THE INVENTION

The present invention allows the removal without stiction of the inorganic fluoride residues (either metal-based or non-metal-based) formed during the Vapor HF release process. It has been found surprisingly that the problems described in the prior art can be overcome by employing an all-dry water vapor cleaning approach to remove the residues and further that satisfactory cleaning can take place at a temperature and pressure well below the critical point for water.

Accordingly the invention provides a method of removing residues from an integrated device, and especially an integrated device that has been subjected to a vapor HF process, comprising exposing the fabricated device to dry water vapor for a period of time sufficient to dissolve the residues in said dry water vapor.

The pressure/temperature ratio of the water vapor should be controlled to increase the density of the water vapor sufficiently to increase the dissolution potential of the water vapor, and preferably the pressure/temperature ratio of the water vapor should lie in the range of about 0.005 to 0.007 atm/K.

BRIEF DESCRIPTION OF THE DRAWINGS

The invention will now be described in more detail, by way of example only, with reference to the accompanying drawings, in which:

FIG. 3 shows the detailed XPS spectra for Fls, F-Auger and Al2p peaks for a sample processed in Vapor HF with Al on the devices;

FIG. 4 shows the Al fluoride residues observed on MEMS devices after a Vapor HF release process performed in presence of Al;

FIG. 5 is an SEM picture showing the absence of residue when no Al is present on the wafer during the Vapor HF release process;

FIG. 8 shows detailed XPS spectra for Fls, F-Auger and Al2p peaks for a metallized sample prior to Vapor HF processing;

FIG. 9 presents the various steps leading to the formation of $AlF_3$;

FIG. 12 shows the effect of a methanol spray rinse;

FIG. 13 shows the effect of DI water soaking;

FIG. 14 shows the effect of DI water spray rinse;

FIG. 15 shows the effect of Ultrasonic DI water treatment;

FIG. 16 shows the effect of a Megasonic DI rinse approach;

FIG. 19 shows the detailed XPS spectra for Fls, F-Auger and Al2p peaks for a metallized sample after the water vapor cleaning process;

FIG. 20 is a summary of the XPS analyses performed on Al-metallized MEMS devices;

FIG. 21 illustrates an $H_2O$ molecule dipole and dipole moments of selected substances (ref. B. G. Segal);

FIG. 22 shows the dielectric constants of selected liquids (ref. B. G. Segal);

FIG. 26 shows the supercritical-$CO_2$ Critical Point Drying method (cf Jang et al.);

FIG. 28 shows a water Vapor clean approach (3 h exposure time to Water Vapor);

DETAILED DESCRIPTION OF THE PREFERRED EMBODIMENTS

Metal-based Residues

The following comparative examples and examples of the invention demonstrate the advantages of the invention. This exercise was completed by taking into account the most commonly used CMOS-compatible metals in the semiconductor industry such as Al, Ti, Cu, Ta, W, Co and Ni.

Al-based residues

Al-based residue formation

Figures 1, 2:
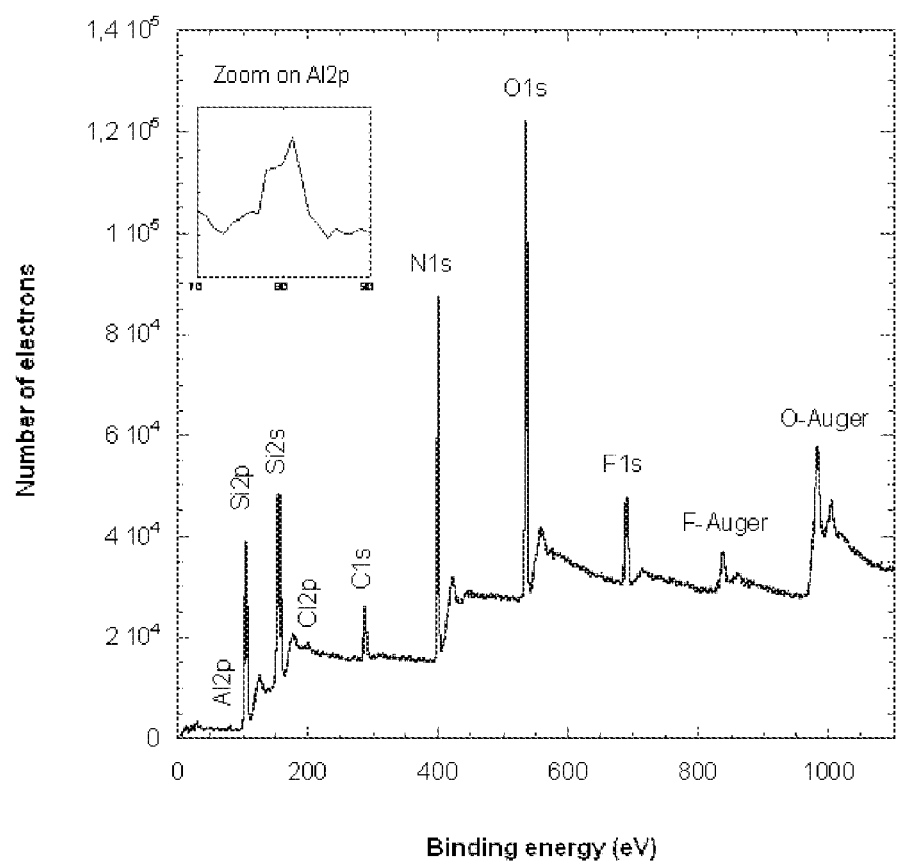
FIG. 1 lists XPS analyses demonstrating the presence of $AlF_3$-based residues formed during the Vapor HF release process performed in presence of Al structures.
FIG. 2 shows the XPS spectrum of the sample after Vapor HF performed with Al on the devices.

In the case of a Vapor HF process performed in presence of Al, the XPS analyses data gathered in the field area in-between MEMS devices and shown in FIG. 1 (summary table) and FIG. 2 and FIG. 3 (binding energy spectra) demonstrate that the residues formed is an Al fluoride compound ($AlF_3$) based on 2 observations from the XPS analyses:

a. The F/Al atomic ratio is approximately 3;
 b. The Al2p binding energy is of 75.8 eV which is typical for $AlF_3$ compounds.

$AlF_3$ Formation Mechanism

Although $AlF_3$ has a low solubility of 0.00559 g/cm³ in cold water (25° C.), it is perfectly soluble in hot water but insoluble in acids, alkali, alcohol or acetone. The melting point of $AlF_3$ is of 1291° C. (by sublimation). It is therefore a solid (white crystalline solid) at room temperature. $AlF_3$ is also named Aluminum (III) fluoride, Aluminum fluoride or Aluminum trifluoride. It has been noticed by Tong et al. that $AlF_3$ would be formed by the reaction between the gas-phase HF and the $Al_2O_3$ which is the native oxide that forms on Al upon exposure to air. The formation of AlF$_3$ would then be formed according to the following equation:

$$Al_2O_3 \text{ (s)} + 6 \text{ HF (g)} \rightarrow 2 \text{ AlF}_3 \text{ (s)} + 3 \text{ H}_2\text{O (g)}$$

Such a residue can be observed in FIG. 4 on the SiN film surface as well as under the Poly-1 released structures. One can therefore notice the presence of a post-Vapor HF residue formed only when Al is present on the wafers during the release process as shown in FIG. 5 for non-metallized samples. One may think that there are also residues for that non-metallized wafer. However, it is worth mentioning that the features observed in the field areas are in fact due to the roughness of the SiN attacked during the Vapor HF release process. This roughness is inherent to the Vapor HF process and is therefore not related to the formation of residues during the Vapor HF step performed in presence of Al.

Figures 6, 7:
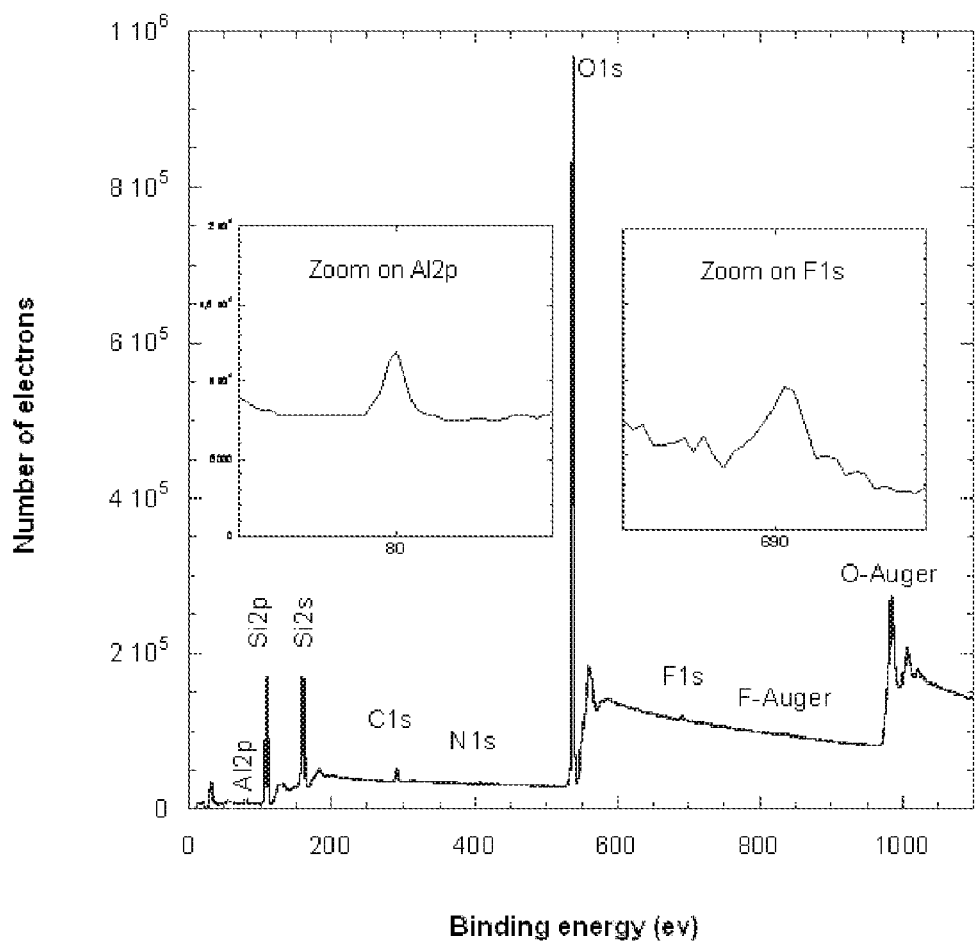
FIG. 6 lists XPS analyses of the residues prior to Vapor HF release process.
FIG. 7 lists the XPS spectrum of the metallized sample prior to Vapor HF release process.

In order to explain the distribution of the AlF$_3$ observed above the SiN surface microns away from the Al lines, XPS analyses were conducted prior to performing the Vapor HF release step. Those XPS analysis data are presented in FIG. 6, FIG. 7, and FIG. 8. As it can be observed from this table, Al was present, although not detectable neither visually nor by EDS analyses, prior to the Vapor HF process. It is believed that some Al atomic layers could have been left from the Al etch step in the field area on the sacrificial oxide films above the SiN and Poly-Si films. Those thin Al atomic layers would form Al$_2$O$_3$ upon exposure to air. During the Vapor HF release, HF would in turn react with this thin layer of Al$_2$O$_3$ leading to AlF$_3$ residue formation. As layers of sacrificial oxides are removed, the AlF$_3$ residues would be retrieved on any surfaces of the MEMS devices as presented on the sketches in FIG. 9 therefore affecting the movements of the released MEMS structures. Such residues thus significantly impact the MEMS device functionality/reliability and wafer yield.

AlF$_3$ Residue Removal Attempts

Figure 10:
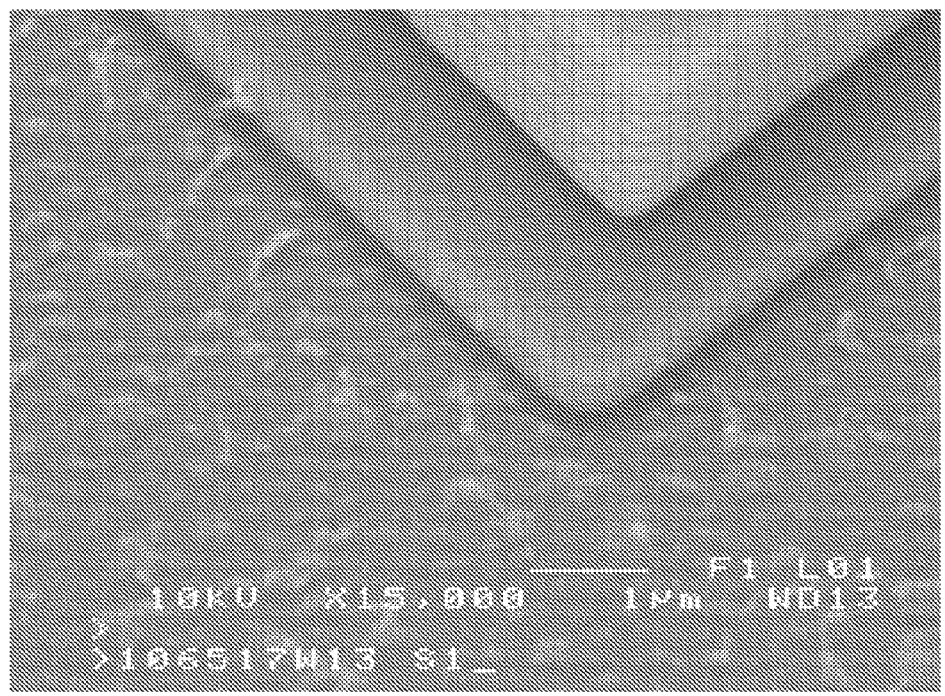
FIG. 10 is an SEM picture still showing the presence of residues (formed in Vapor HF in presence of Al) after a long 30 min. O2 Plasma.
Figure 11:
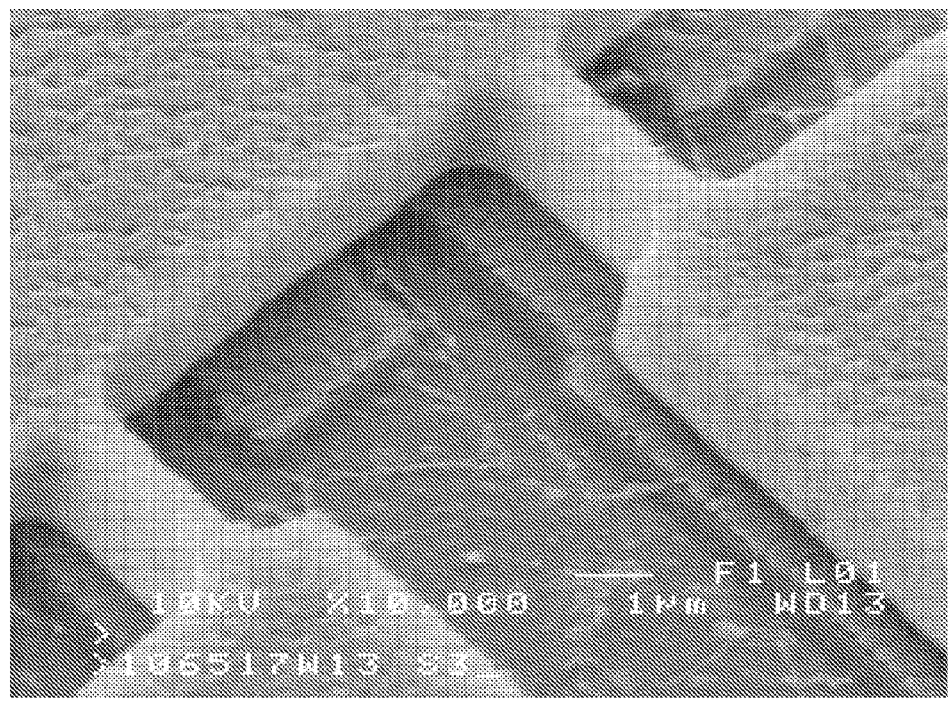
FIG. 11 is an SEM picture still showing the presence of residues (formed in Vapor HF in presence of Al) after a long 30 min. CF4 plasma despite a severe attack of all the other materials on the MEMS device.

Many approaches can be tried in order to remove those AlF$_3$ residues. Such attempts can be done using a plasma approach in order to etch the residues formed during the Vapor HF release in presence of Al. The results of such experiments are presented in FIG. 10 and FIG. 11 for an O$_2$ and a CF$_4$ plasma treatment, respectively. An O$_2$ plasma treatment of 30 min could not even entirely remove the residues as demonstrated in FIG. 10. With the CF$_4$ plasma, the results presented in FIG. 11 show that such a treatment processed for 30 s does not remove the residues but in addition, such an attempt leads to severe attack of all the other materials on the MEMS device. In addition, the disadvantage of a plasma approach is that such a method is anisotropic and could therefore not remove residues properly under the mechanically released structures.

Beside the plasma treatments mentioned above, an alcohol spray rinse was attempted. Although this method allows one to clear most of the residues in the open areas, it appears that some residues cannot be entirely removed from under the Poly-Si relased structures as demonstrated in FIG. 12.

It is worth mentioning that AlF$_3$ has been considered in the past as a self-developing metal fluoride resist. In that case, the AlF$_3$ was patterned using an electronic beam and stripped with water. As mentioned by Chen et al., the AlF$_3$ compound is highly sensitive to the presence of water. It is clear to us that for MEMS devices using an electronic beam in order to remove the post Vapor HF AlF$_3$ residues formed in presence of Al-metallized devices would not be a feasible approach as it would be impossible to remove the residues under the Poly-Si released structures in addition to demonstrating some serious throughput issues. Although the water was sufficient in the case of inorganic fluoride resist stripping, it has been demonstrated (as shown in FIG. 13) that using stagnating DI water could be sufficient to clear the residues in the wide open areas but would not be efficient to remove the residues from under the Poly-Si released structures especially in small gap areas between the released parts.

Even though the DI water soaking approach presented in FIG. 13 shows that this method is not sufficient for clearing the residues from under the Poly-Si structures, it displays some agglomeration of the residues thus suggesting dissolution of those contaminants into water. In addition, the results presented in FIG. 14 obtained using a DI water spray rinse approach suggest that a "mechanical action" during the DI water rinse helps to remove the residues everywhere on the MEMS devices. Such a mechanical action could come from spraying the DI water on the wafers to clean or by using simple agitation of the wafers in the DI water bath during the residue removal process. The following iteration would obviously be to perform an ultrasonic or Megasonic DI water rinse which leads to residue-free MEMS devices even in the small gaps between released structures. We demonstrated that using an ultrasonic DI water rinse thus exciting the H$_2$O molecules causing vibrations and which in turn efficiently remove all residues formed on the wafers during the Vapor HF process performed in presence of Al-based metallization schemes. The results achieved with this concept are demonstrated in FIG. 15 and FIG. 16 for ultrasonic and Megasonic DI water rinse treatments, respectively.

While the "mechanical action" during the DI water rinse such as a spray, ultrasonic or Megasonic DI water rinse as mentioned above allows one to remove the residues formed in presence of Al during the Vapor HF release of the structures of MEMS devices, this approach presents serious drawbacks as presented below:

a. A "mechanical action" may not allow perfect removal of the residues especially in thin gaps between released structures for sensitive and advanced MEMS devices;
 b. The "mechanical action" of the liquid DI water can lead to breakage of fragile MEMS devices;

Broken parts on the wafers can therefore create yield degradation along with potential cross-contamination of wafers on the following lots to be processed which would then be a major manufacturing issue in a high-volume production environment.

Stiction is a major concern and the main drawback if a liquid-based rinse is used to clean the residues formed during the Vapor HF release. AlF$_3$ residue removal method in water vapor In order to circumvent all the above issues, an all-dry water vapor cleaning approach in accordance with the invention was found to efficiently remove the by-products left behind after the Vapor HF process without stiction nor any corrosion of the Al structures.

Figures 17, 18:
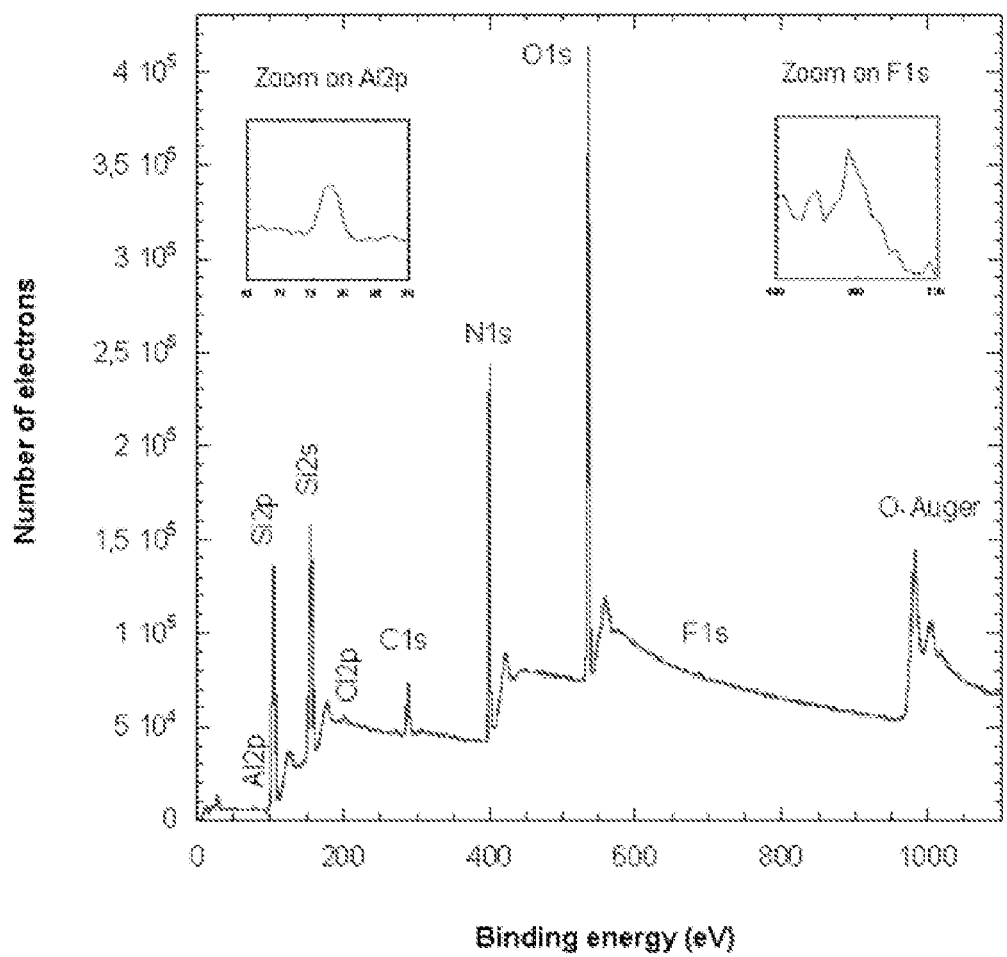
FIG. 17 shows the XPS analyses of the residues after the water vapor cleaning process.
FIG. 18 shows the XPS spectrum of the metallized sample after the water vapor cleaning process.

The XPS data presented in FIG. 17, FIG. 18 and FIG. 19 demonstrate that the F atomic concentration has been significantly reduced from 2.6 (cf. FIG. 1 after Vapor HF) to 0.18% (cf. FIG. 17 after a wafer vapor process). On the other hand, the Al atomic concentration has only been reduced from 1.0% to 0.7% as observed in FIG. 1 and FIG. 17, respectively. In addition, while the Al2p binding energy of 75.8 eV after the Vapor HF process was suggesting the presence of AlF$_3$, the Al2p binding energy after the water vapor treatment is of 74.75 eV. This Al2p binding energy value of 74.75 eV after the water vapor process now suggests the presence of AlN or Al$_2$O$_3$. It is therefore believed that the water vapor dissolved some of the AlF$_3$ residues (the mechanisms for such a dissolution will be explained in Section 0). It is however believed that the remaining $AlF_3$ solid residues were transformed back into $Al_2O_3$ as follows:

$$2\ AlF_3\ (s) + 3\ H_2O\ (g) \rightarrow Al_2O_3\ (s) + 6\ HF\ (g)$$

Summary of the XPS Data for $AlF_3$ Residue Removal

The table presented in FIG. 20 summarizes the XPS data presented above along with the proposed compounds observed either prior to or after Vapor HF as well as after the water vapor cleaning process.

Ti-based Residues

Another potential inorganic fluoride formed during a Vapor HF process performed in presence of a metallization scheme could potentially be Ti fluorides such as $TiF_3$ or $TiF_4$. Such Ti fluoride residues could form from both Ti or TiN metallization layers as Ti oxides could form in both cases according to Caron et al.

1. $TiF_3$ compound $TiF_3$ is also known as titanium (III) fluoride, titanium fluoride or titanium trifluoride. It is a violet crystalline solid with a melting point of 1200° C. and a boiling point of 1400° C. Its density is of 3000 kg m$^{-3}$. It is insoluble in water. However, it appears that a purple-red form also exists which is soluble in water.

As it was the case for Al, if we suppose that the Vapor HF would react with the Ti oxides rather than the metal itself, we can identify the following equation:

$$Ti_2O_3\ (s) + 6\ HF\ (g) \rightarrow 2\ TiF_3\ (s) + 3\ H_2O\ (g)$$

$TiF_4$ Compound

Another possible Ti fluoride compound is $TiF_4$ also know as titanium (IV) fluoride or titanium tetrafluoride. It is a white solid with a melting point of 284° C. and a density of 2800 kg m$^{-3}$. It is soluble (decomposes) in water as well as in sulfuric acid, alcohol and $C_6H_5N$. It is however insoluble in ethanol.

We can assume that $TiF_4$ would form according to the following reaction:

$$TiO_2\ (s) + 4\ HF\ (g) \rightarrow TiF_4\ (s) + 2\ H_2O\ (g)$$

Although liquid DI water could be used in order to remove Ti-based fluoride residues formed due to the reaction of Ti oxides with HF during the Vapor HF release process, a water vapor approach can be used as for the Al fluorides to circumvent the drawbacks of using a liquid-based cleaning approach.

Cu-based Residues

In the case of Cu interconnects, one could assume the formation of Cu fluorides. In such a case, the compound formed would presumably be $CuF_2$ also known as copper (II) fluoride, copper difluoride, copper fluoride or cupric fluoride. It is a white crystalline solid which turns blue in moist air. The melting point of this compound is of 785° C. (under $N_2$) and a boiling point of 1676° C. The density of $CuF_2$ is of 4200 kg m-3. $CuF_2$ has a solubility of 0.047 g/cm$^3$ in cold water and is entirely soluble in hot water. It is however insoluble in alcohol.

We can assume that $CuF_2$ would form according to the following reaction:

$$CuO\ (s) + 2\ HF\ (g) \rightarrow CuF_2\ (s) + H_2O\ (g)$$

Although liquid DI water could be used in order to remove Cu-based fluoride residues formed due to the reaction of Cu oxides with HF during the Vapor HF release process, a water vapor approach could be used as for the Al fluorides to circumvent the drawbacks of using a liquid-based cleaning approach.

Ta-based Residues

Tantalum is a material used in Cu interconnects as an adhesion layer or a barrier layer either as pure Ta or TaN. One could therefore assume the formation of Ta fluorides such as $TaF_5$ also know as tantalum (V) fluoride, tantalum fluoride or tantalum pentafluoride. This is a white crystalline solid with a melting point of 97° C. (thus a solid at room temperature) and a boiling point of 229° C. Finally, it has a density of 5000 kg m$^{-3}$. This compound is soluble in water, HF and ethanol.

We can assume that $TaF_5$ would form according to the following reaction:

$$Ta_2O_5\ (s) + 10\ HF\ (g) \rightarrow 2\ TaF_5\ (s) + 5\ H_2O\ (g)$$

Although liquid DI water could be used in order to remove Ta-based fluoride residues formed due to the reaction of Ta oxides with HF during the Vapor HF release process, a water vapor approach can be used as for the Al fluorides to circumvent the drawbacks of using a liquid-based cleaning approach.

W-based Residues

W interconnects could also be envisioned. In such a case, it would then be possible to form W fluorides. Although $WF_6$ is a gas at room temperature, $WF_4$ is a possible solid residue at room temperature as its melting point is of 800° C. It is a red-brown or black solid also known as tungsten (IV) fluoride, tungsten fluoride or tungsten tetrafluoride.

Regarding $WF_6$, it is also known as tungsten (VI) fluoride, tungsten fluoride or tungsten hexafluoride. It is a colorless gas with a melting point at 2° C., a boiling point at 17° C. and a density of 13.1 g/L.

We can assume that $WF_4$ and $WF_6$ would form according to the following reaction:

$$WO_2\ (s) + 4\ HF\ (g) \rightarrow WF_4\ (s) + 2\ H_2O\ (g)$$

and $$WO_3\ (s) + 6\ HF\ (g) \rightarrow WF_6\ (g) + 3\ H_2O\ (g),$$

respectively.

As $WF_6$ is a gas at room temperature, it could not lead to the formation of a solid residue on advanced MEMS devices. However, the $WF_4$ compound can obviously be found on the wafers as a solid. In that case, it is found in the literature that such a W fluoride compound decomposes in water.

Although liquid DI water could be used in order to remove the solid $WF_4$ fluoride residues formed due to the reaction of $WO_2$ with HF during the Vapor HF release process, a water vapor approach can be used as for the Al fluorides to circumvent the drawbacks of using a liquid-based cleaning approach.

Co-based Residues

Cobalt (Co) is a material that is CMOS compatible and is mainly used for forming silicides. However, one could also use this metal for interconnection purposes on MEMS devices. One could therefore assume the formation of Co fluorides such as $CoF_2$ also known as cobalt (II) fluoride, cobalt fluoride or cobalt difluoride. This is a pink crystalline solid with a melting point of 1200° C. (thus a solid at room temperature) and a boiling point of 1400° C. Finally, it has a density of 4460 kg m$^{-3}$. This compound is soluble in water (1.5 g/100 cm$^3$ of cold water and entirely soluble in hot water). Co difluoride is also slightly soluble in acids but insoluble in alcohol, ethanol and benzene.

We can assume that $CoF_2$ would form according to the following reaction:

$$CoO\ (s) + 2\ HF\ (g) \rightarrow CoF_2\ (s) + H_2O\ (g)$$

Although liquid DI water could be used in order to remove the Co fluoride residues formed due to the reaction of CoO with HF during the Vapor HF release process, a water vapor approach can be used as for the Al fluorides to circumvent the drawbacks of using a liquid-based cleaning approach.

Ni-based Residues

Nickel (Ni) is a material that is CMOS compatible and is mainly used for forming silicides. However, one could use this metal for interconnection purposes on MEMS devices. One could therefore assume the formation of Ni fluorides such as $NiF_2$ also know as nickel (II) fluoride, nickel fluoride or nickel difluoride. This is a yellow crystalline solid that sublimates in HF at 1000° C. (thus a solid at room temperature). Finally, it has a density of 4700 kg m$^{-3}$. This compound has a solubility of 4 g/cm in cold water and is also soluble in acids, alkali, ethanol as well as $NH_3$.

We can assume that $NiF_2$ would form according to the following reaction:

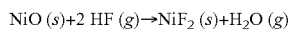

$$NiO\ (s) + 2\ HF\ (g) \rightarrow NiF_2\ (s) + H_2O\ (g)$$

Although liquid DI water could be used in order to remove the solid Ni fluoride residues formed due to the reaction of Ni oxide with HF during the Vapor HF release process, a water vapor approach can be used as for the Al fluorides to circumvent the drawbacks of using a liquid-based cleaning approach.

As it has been described and demonstrated above, the above solid CMOS-compatible metal fluoride residues are all soluble in liquid water to some extent. All those residues can therefore be removed/cleaned using a water vapor approach thus avoiding any stiction issues that would be faced using a liquid water cleaning method.

Non-metal-based Residues

As presented above, the reaction between Silicon Nitride ($Si_3N_4$) used as an etch stop during the release process and the Vapor HF leads to the formation of ammonium fluorosilicate residues as follow:

$$Si_3N_4\ (s) + 16\ HF\ (g) \rightarrow 2\ (NH_4)_2SiF_6\ (s) + SiF_4\ (g)$$

As mentioned by Ouellet et al. supra, this ammonium fluorosilicate compound is also know as ammonium silicofluoride, ammonium fluorisilicate, ammonium hexafluorosilicate or bararite. It is a white cubic (2.011 g/cm$^3$) or triclinic (2.152 g/cm$^3$) crystal at room temperature. It is also soluble in water (250 g/l at 20° C.). However, removing this residue by using liquid water would lead to potential stiction if the devices are not dried properly. This ammonium fluorosilicate residue is thermally unstable and decomposes to form ammonium bifluoride at a temperature higher than 100° C. as follow:

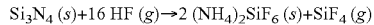

$$(NH_4)_2SiF_6\ (s) \rightarrow NH_4HF_2\ (s) + SiF_4\ (g) + NH_3\ (g)$$

As indicated by Ouellet et al., supra this $NH_4HF_2$ compound is also called ammonium hydrogendifluoride has a melting point of 125° C. and a decomposition temperature of 238° C. As also pinpointed by Ouellet et al., the $NH_4HF_2$ compound is also soluble in water (630 g/l at 20° C.).

In both cases, the $(NH_4)_2SiF_6$ and $NH_4HF_2$ compounds can be dissolved in a water vapor environment. Although Ouellet et al.'s invention eliminates those 2 compounds in-situ, the current prsent now allows one to eliminate any residues inadvertently left on the MEMS wafers. The current invention therefore allows one to achieve a more robust process and therefore better reliability data as well as higher yield as any residues left on the wafers from the previous steps could easily be dissolved using this water vapor method.

Mechanism of Residue Dissolution in Water Vapor

The dissolution mechanisms related to liquid water are now well understood. The solutes can be categorized in two categories:
 a. Electrolytes
 b. Non-electrolytes Dissolution of Electrolytes in Water For the dissolution of ionic crystalline solids, the solvent characteristics of water are mainly caused by the following properties and phenomena:
 a. The dipole moment of water;
 b. The dielectric constant of water.

The dipole of water (cf. FIG. 21) leads to a force of attraction that orients any ion. The ions are then hydrated or solvated. Another possible dissolution mechanism is based on the dielectric constant of water which is much higher than other substances. The force of attraction between two particles can then be expressed according to Coulomb's law as follow:

$$F = kq_1q_2/Dr^2$$

where F is the attraction force, D is the dielectric constant of the medium, $q_1$ and $q_2$ are the charges of the particles and k is a constant. Therefore, the larger the dielectric constant of the medium, the smaller the force of attraction. As shown in FIG. 22, water has a large dielectric constant compared to other liquids at 25° C. This therefore means that it is much easier to separate ions from each other in water compared to most other liquids.

Figure 23:
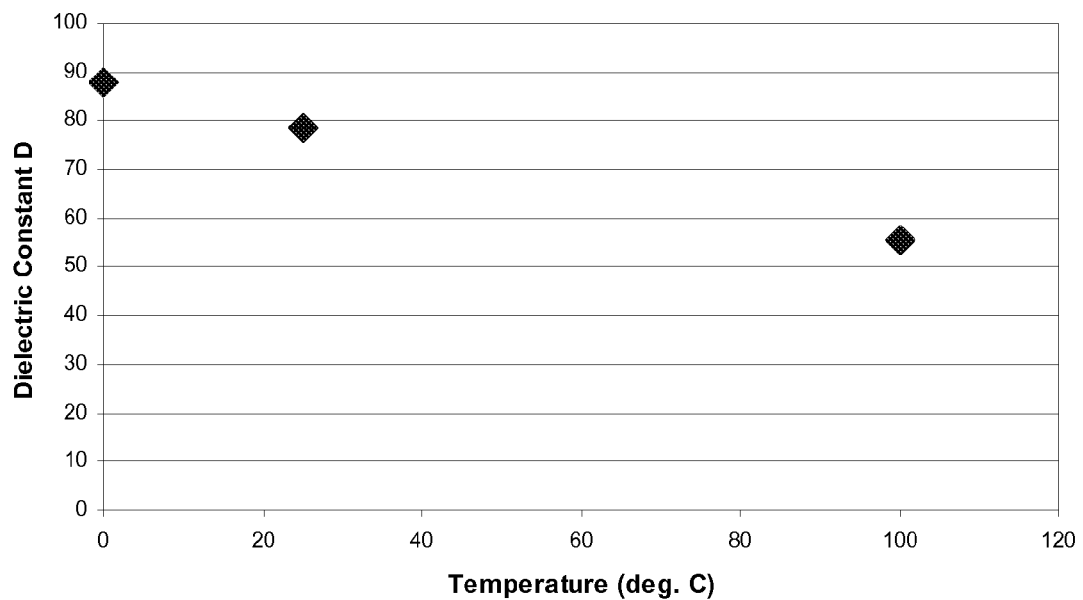
FIG. 23 shows the dielectric constant of water as a function of temperature.

The high dielectric constant of water is caused by the hydrogen bonding. However, it is important to realize that the dielectric constant of water decreases as the temperature increases (cf. FIG. 23).

Dissolution of Non-electrolytes in Water

Non-electrolyte crystalline solids can also dissolve in water although they do not form any ions. This phenomena is once again explained by the polar nature of the water molecule. In general, polar solutes can form hydrogen bonds with a polar solvent such as water. The non-electrolyte compounds would then dissolve in water without separating into ions by forming hydrogen bonds with the water molecules.

Dissolution of Residues in Water Vapor

Although the density of water molecules is much less in water vapor than in the liquid phase, it is believed that the gas phase preserves the solvent properties mentioned above. Ideally the best conditions to dissolve a solid in a gas phase (in order to avoid stiction of the mechanical parts) would be to process the samples using water above its critical point in order to reach a density equivalent to the ones of liquids while keeping the gas-phase properties. The critical temperature of a substance is the temperature above which the gas cannot be liquefied. The critical pressure is the pressure required to liquefy the gas at its critical temperature. This therefore means that for water the critical temperature would be above 374.1° C. and a critical pressure above 218.3 atm. Those conditions although achievable would lead to unacceptable operating conditions and cost-of-ownership in order to manufacture high-volume advanced MEMS devices.

The current invention therefore focused on the gas-phase solvent properties of water in order to avoid any risks of stiction and still manufacture low-cost and high volume MEMS devices. In order to achieve better solvent properties in gas phase, our invention is focused towards identifying process conditions allowing one to increase the density of water molecules. This can be done based on the ideal gas law equation:

$$PV = nRT$$

where P is the pressure (in atm), V is the volume (in L), n is the number of moles, R is a constant equals to 0.082068 L·atm·mol$^{-1}$·K−1 and T is the temperature expressed in Kelvins (K).

From this equation, it can be determined that for a fixed volume process chamber, we can increase the density (in moles/L) by varying the P/T ratio as follow:

$$\text{Density} = n\text{NV} = P/RT$$

Figure 24:
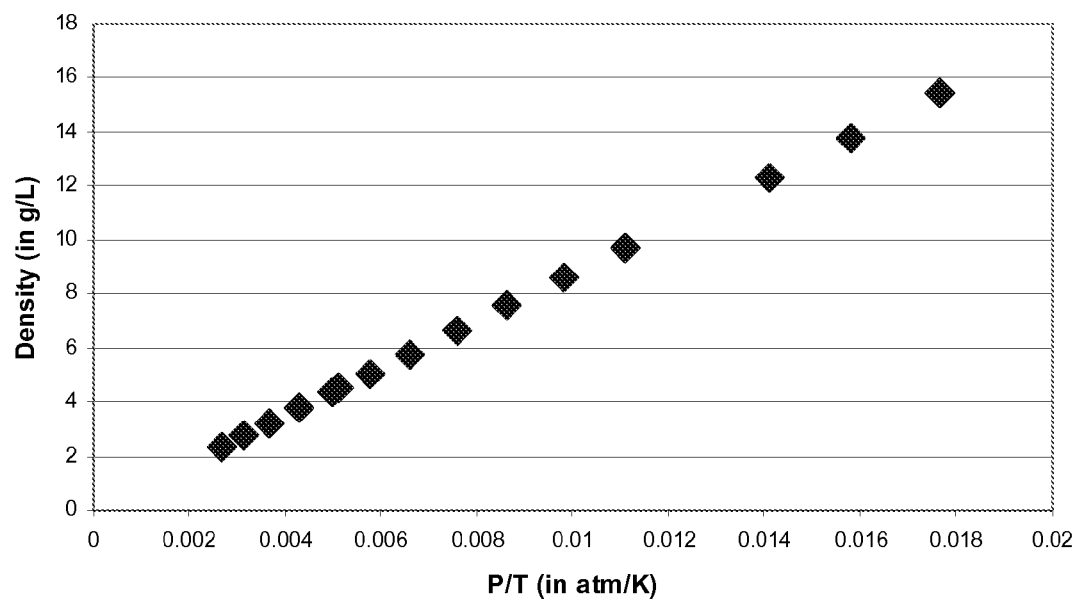
FIG. 24 shows the density of water vapor vs. Pressure/Temperature.

The density n/V of water vapor molecules is represented as a function of P/T in FIG. 24. It can be observed from this figure that increasing the P/T ratio allows one to significantly increase the density of water molecules in the gas. This therefore means that although operating well below the critical point (where P/T=0.33727 atm/K), the density of water molecules in a gas can be significantly increased thus increasing the dissolution potential of the water vapor environment.

Dissolution of Inorganic Metal-based Residues

As the $AlF_3$ and the other metallic fluoride residues doe not form electrolytes, the dissolution of those compounds into water can therefore only be explained through the non-electrolyte dissolution mechanism based on the hydrogen bonds that form.

Dissolution of Inorganic Non-metal-based Residues

In the case of the non-metallic residues such as the ammonium fluorosilicate $((NH_4)_2SiF_6)$ compound, this molecule can be separated into two ions as follows:

The dissolution of ammonium fluorosilicate in water is thus carried out according to the electrolyte dissolution mechanism in water.

The same dissolution mechanism can be applied to the ammonium bifluoride compound as it can be separated into the following ions according to the equation:

Figure 25:
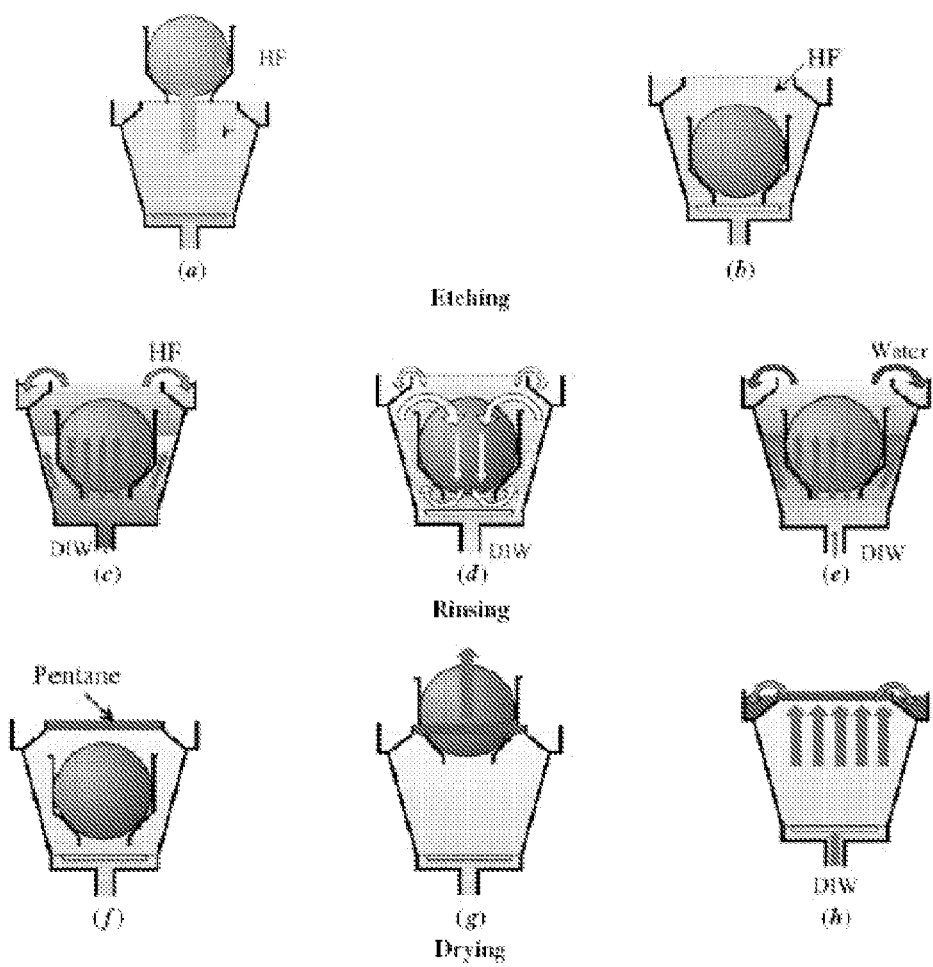
FIG. 25 is an example of an etch/rinse/dry in liquid approach (cf. Raccurt et al.)
Figure 27:
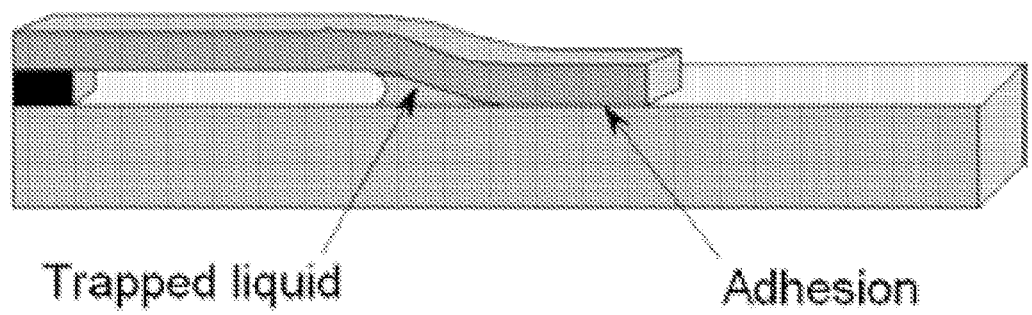
FIG. 27 is a drawing explaining the stiction issue (cf Raccurt et al.)

Although an ultrasonic or Megasonic DI water rinse leads to residue-free MEMS devices even in the small gaps between released structures, such a method involves major concerns in terms of stiction. With liquid cleaning approaches, appropriate drying methods (either alcohol drying or supercritical-$CO_2$ critical point drying—cf. FIG. 25 and FIG. 26) are necessary in order to avoid stiction between 2 mechanically released parts or between a released part and a non-released layer (cf. FIG. 27). Stiction would thus lead to serious yield and device functionality issues.

In order to optimize the process for larger samples and batches of wafers, the current invention presented has been optimized. The preferred embodiment is to run the wafers in a TABAI TPC-421 system. This a humidity chamber sold be Tabai Espec Corp. The processing conditions were:

Temperature: 121° C. (394.15K)
Pressure: 2.0227896 amt (i.e. about 2 atms)
Pressure/Temperature: 0.00513203 atm/K
Total process time: 4 h In a second example, the temperature was 133° C. (406.15).

A suitable range of P/T values lies between 0.00513203 and 0.00717511 atm/K, or about 0.005 to 0.007 atm/K. It has been demonstrated that at these values, surprisingly, it is possible to remove the fluoride residues without the attendant disadvantages of the prior art methods.

Figure 29:
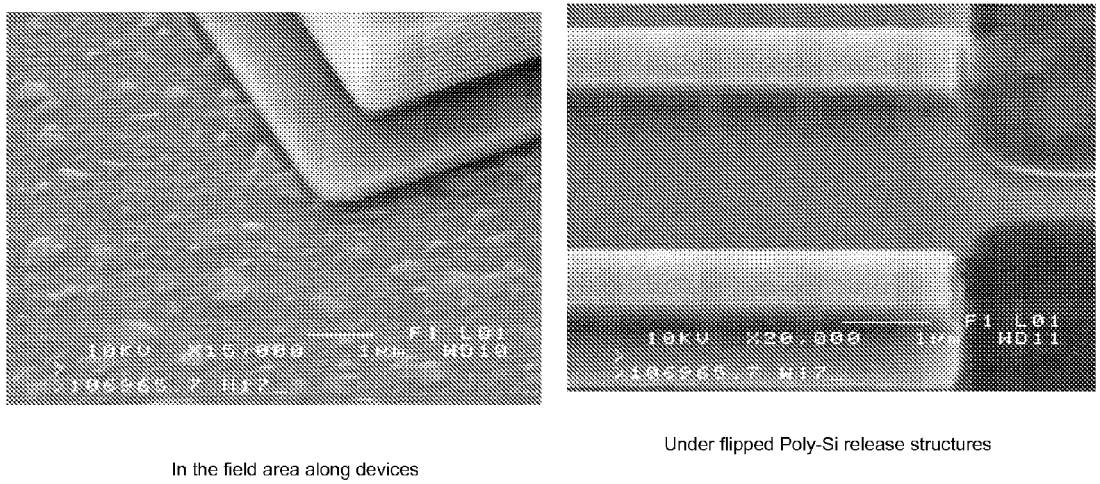
FIG. 29 shows a water vapor clean approach (total processing time of 4 h in water vapor)

The cleanliness achieved with this new water-vapor stiction-free residue removal method is presented in FIG. 29. In addition, it has been demonstrated that this invention does not present detrimental effects on the Al interconnections such as corrosion when processing the wafers with the preferred embodiment presented above.

In that case, it is then an all-dry approach as there is no condensed water formed on the wafers therefore entirely eliminating the risks of stiction. It has also been demonstrated that this invention does not lead to corrosion of the Al structures. In addition, a significant advantage of this invention is that appropriate drying techniques and systems are not necessary anymore. It therefore drastically reduces the cost-of-ownership of this process in addition to improving the cycle time as there are fewer steps required with this new invention.

Figure 30:
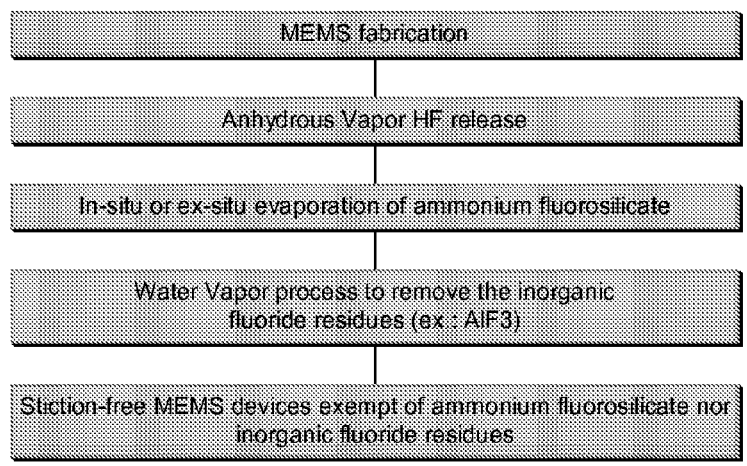
FIG. 30 is a flow diagram for removal of post Vapor HF residues.

The flow diagram presented in FIG. 30 demonstrates the sequence of the processing steps for the preferred embodiment of this invention. In particular, after fabrication the MEMS device is subjected to an anhydrous HF vapor release step followed by an in-situ or ex-situ evaporation of ammonium fluorosilicate. The wafer is then subjected to the novel water vapor release process in accordance with the invention to remove the inorganic fluoride residues. This results in a stiction-free MEMS device without ammonium The invention could in some cases be performed in conjunction with a water vapor spray (dynamic system) on the wafers/samples to remove the residues, and the pressure in the static chamber to perform the water vapor treatment could be varied.

The water vapor treatment could also be followed by another cleaning method to enhance the device performance or properties. The additional cleaning method described above could be for instance an ozone ($O_3$) treatment. The water vapor cleaning treatment could potentially be followed by a thermal treatment to enhance the device performance or properties.

This invention could be applied to the manufacture of any Micro-Electro-Mechanical Systems (MEMS) such as microgyroscopes, micro-accelerometers, RF micro-resonators, micro-mirrors, micro-motors, micro-actuators and other such micro-devices integrating very sensitive moving mechanical parts.

In addition to MEMS-related applications, this invention could be used for advanced integrated circuits (ex.: CMOS), 3D semiconductors or any other type of applications where a Vapor HF process is performed to remove $SiO_2$ films (native oxide, grown oxide or deposited oxide) or clean a surface in presence of a metal. In such a case, the current invention would be useful in order to remove any water-soluble type of metal fluoride residues or other water-soluble inorganic fluorine-based residues that is either an issue to improve electrical performance, adhesion or any other film/material properties to enhance the device performances.

Finally, this invention could also be used in order to enhance or modify the surface properties for MEMS and lid wafers bonding for example and therefore, enhance the wafer-level packaged device reliability and overall wafer yield.

We claim:

1. A method of making a MEMS integrated device with moving mechanical parts, comprising:
    performing an anhydrous vapor release step to release the moving mechanical parts in said MEMS device, said release step comprising subjecting a partially fabricated MEMS device including sacrificial material to hydrogen fluoride vapor to remove said sacrificial material;
    subsequently performing a cleaning step to remove fluoride residues created in the release step wherein the MEMS device is placed in a chamber containing dry water vapor wherein the pressure/temperature ratio of the water vapor lies in the range of about 0.005 to 0.007 atm/K and wherein there is no condensation on the MEMS device, and wherein the MEMS device is exposed in said chamber to said dry water vapor for a period of time sufficient dissolve said fluoride residues in said dry water vapor, and wherein ammonium fluorosilicate is formed during said release step, and prior to performing said cleaning step, said MEMS device is subjected to an evaporation step to remove said ammonium fluorosilicate.

2. A method as claimed in claim 1, wherein the temperature is about 121° C. and the pressure is about 2 atmospheres.

3. A method as claimed in claim 2, wherein said fabricated device is exposed to said dry water vapor for a period of about 4 hours.

4. A method as claimed in claim 1, wherein the temperature is about 133° C.

5. A method as claimed in claim 1, wherein the residues comprise ammonium bifluoride ($NH_4HF_2$).

6. A method as claimed in claim 1, wherein the residues comprise a metal fluoride solid compound at room temperature.

7. A method as claimed in claim 6, wherein the residues comprise aluminum fluoride ($AlF_3$) solid crystal; a titanium fluoride ($TiF_3$ or $TiF_4$) solid crystal; a copper fluoride ($CuF_2$) solid crystal; a tantalum fluoride ($TaF_5$) solid crystal; a tungsten fluoride ($WF_4$) solid crystal; a cobalt fluoride ($CoF_2$) solid crystal, a nickel fluoride ($NiF_2$) solid crystal, or a combination thereof.

8. A method as claimed in claim 1, wherein the exposure to dry water vapor is performed with multiple passes.

9. A method as claimed in claim 1, wherein the exposure to dry water vapor is performed in a multi-step process.

* * * * *